(12) United States Patent
Hoegberg

(10) Patent No.: US 10,664,372 B2
(45) Date of Patent: May 26, 2020

(54) DATA BUS AND TESTING SYSTEM UTILIZING BUS-HOLD FEATURE

(71) Applicant: Hamilton Sundstrand Corporation, Charlotte, NC (US)

(72) Inventor: Lon R. Hoegberg, Belvidere, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 177 days.

(21) Appl. No.: 15/918,377

(22) Filed: Mar. 12, 2018

(65) Prior Publication Data

US 2019/0278678 A1 Sep. 12, 2019

(51) Int. Cl.
*G06F 11/26* (2006.01)
*G06F 11/22* (2006.01)
*H04B 3/46* (2015.01)
*G01R 31/58* (2020.01)

(52) U.S. Cl.
CPC ............ *G06F 11/26* (2013.01); *G06F 11/221* (2013.01); *H04B 3/46* (2013.01); *G01R 31/58* (2020.01)

(58) Field of Classification Search
CPC ............................... G06F 11/26; G06F 11/221
See application file for complete search history.

(56) References Cited

U.S. PATENT DOCUMENTS

| 4,475,195 A | 10/1984 | Carey | |
|---|---|---|---|
| 5,224,107 A * | 6/1993 | Mattes | G11C 29/10 714/718 |
| 5,834,949 A * | 11/1998 | Oba | H04L 25/028 326/86 |
| 5,872,792 A * | 2/1999 | Saitoh | G06F 11/2635 714/719 |
| 7,028,237 B2 * | 4/2006 | Masuda | G06F 11/27 714/43 |
| 2003/0052706 A1 * | 3/2003 | Caty | G06F 13/4077 326/16 |
| 2012/0250433 A1 * | 10/2012 | Jeon | G11C 8/18 365/193 |
| 2017/0192053 A1 * | 7/2017 | Jacquet | G01R 31/3177 |

FOREIGN PATENT DOCUMENTS

JP 2002156416 A 5/2002

OTHER PUBLICATIONS

Extended European Search Report for European Patent Application No. 19162220.8, completed Jul. 8, 2019.

* cited by examiner

*Primary Examiner* — Paul Contino
(74) *Attorney, Agent, or Firm* — Carlson, Gaskey & Olds, P.C.

(57) ABSTRACT

An example data bus and testing system includes a data bus, first device, and second device. The first device is configured to transmit test data on the data bus, hold the transmitted test data on the data bus using a bus-hold feature, and read back the test data from the data bus during application of the bus-hold feature. The second device is configured to determine whether a fault condition exists on the data bus based on whether the read back test data differs from the transmitted test data. A method of testing a data bus is also disclosed.

18 Claims, 2 Drawing Sheets

DATA BUS AND TESTING SYSTEM UTILIZING BUS-HOLD FEATURE

BACKGROUND

This application relates to data buses, and more particularly to testing a data bus.

Data buses are used to facilitate communication between a plurality of devices in a computing system. A data bus provides for transmission of bits of data between a sending device and at least one receiving device. Data buses can be parallel buses, which carry data words in parallel on multiple wires, for example. Failure of a data bus in a computing system can result in unpredictable and undesired operation.

SUMMARY

An example data bus and testing system includes a data bus, first device, and second device. The first device is configured to transmit test data on the data bus, hold the transmitted test data on the data bus using a bus-hold feature, and read back the test data from the data bus during application of the bus-hold feature. The second device is configured to determine whether a fault condition exists on the data bus based on whether the read back test data differs from the transmitted test data.

An example method of testing a data bus includes transmitting test data on a data bus, holding the transmitted test data on the data bus using a bus-hold feature, and reading back the test data from the data bus during application of the bus-hold feature. The transmitting, holding, and reading are performed by a first device. The method also includes determining whether a fault condition exists on the data bus based on whether the read back test data differs from the transmitted test data.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
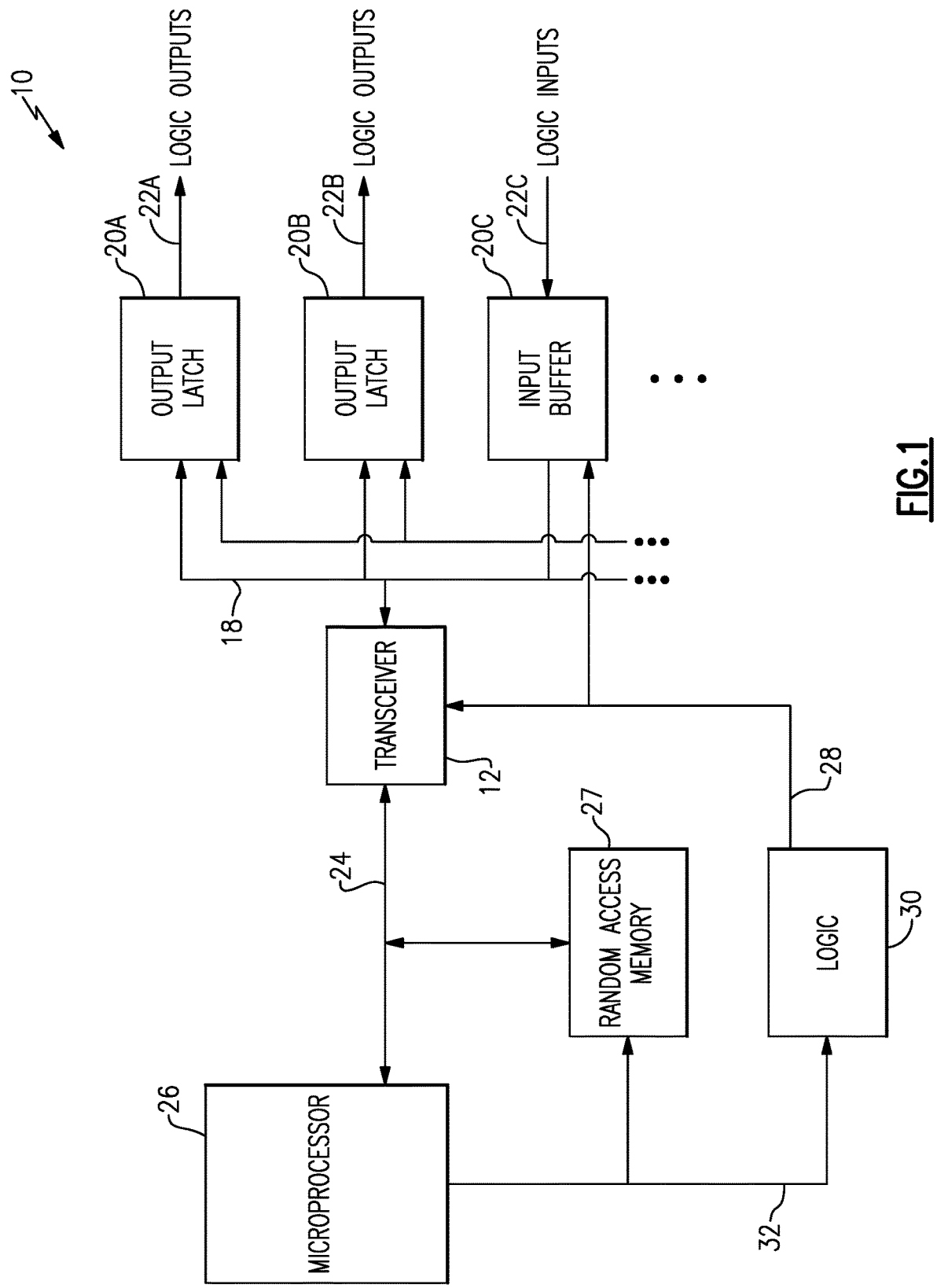
FIG. 1 is a schematic view of an example data bus testing system.

FIG. 1 schematically illustrates an example system 10 that includes a transceiver 12 configured to use a data bus 18 to communicate with a plurality of devices 20. In the example of FIG. 1, the plurality of devices 20 include output latches 20A-B and an input buffer 20C, but any number of devices 20 could be connected to the data bus 20.

The output latches 20A-B receive a data over the data bus 18, and output and hold that data on their respective output lines 22A, 22B. The input buffer 20C is configured to receive data over its input line 22C and provide that data to the transceiver 12 over the data bus 18. Each of the devices 20A-C has a respective address on the data bus 18, and is configured to ignore data transmitted to addresses other than their own address.

The transceiver 12 uses a separate data bus 24 to communicate with a microprocessor 26. The transceiver 12 acts as an intermediary between the devices 20 and the microprocessor 26 by, e.g., retransmitting data from the microprocessor 26 to the output latches 20A-B, and retransmitting data received from the input buffer 20C to the microprocessor 26.

The transceiver 12 is configured to implement a bus-hold feature when transmitting data to the devices on the data bus 18. The bus-hold feature causes the transceiver 12 to hold its last transmitted value on the data bus 18 after transmission until there is a transaction that causes the transceiver 12 to drive to an opposite value onto the data bus 18.

A typical transceiver provides a high or a low output signal based on its input. However, when an input is not provided to a transceiver, unpredictable floating output values can occur because the transceiver is non-driven. An unpredictable floating output can also occur when a transceiver exhibits a "tri-state" condition during which its output assumes a high impedance state. Prior art transceivers typically include a pull up resistor or a pull down resistor that is external to the transceiver to provide for a known output value when no input is being provided, so that unpredictable output values can be avoided. Bus-hold devices can omit such pull up or pull down resistors by providing a weak pull up (soft high) or a weak pull down (soft low) through known bus-hold techniques.

In one example, soft hold values of the transceiver 12 include a bus-hold high (BHH) current value used to hold a given bit to a soft high value, and a bus-hold low (BHL) current value used to hold a given bit to a soft low value. The bus-hold values are "soft" values that can be overwritten by "hard" current values (e.g., bus hold high overdrive "BHHO" or bus hold low overdrive "BHLO") that have a larger magnitude than the soft values. In this fashion, individual bit values that are held on the data bus 18 through the bus hold feature do not interfere with subsequent values provided to the data bus 18 from other devices (e.g., input buffer 20C).

The transceiver 12 is configured to test the data bus 18 using its bus-hold feature by transmitting test data on the data bus 18, holding the transmitted test data on the data bus 18 using the bus-hold feature, and reading back the test data from the data bus 18 during application of the bus-hold feature. In this regard, the transceiver 12 is able to act as its own memory unit for the test data. In one example, the test data is an N-bit data word, where N is a power of 2 (e.g., 2, 4, 8, 16, etc.).

A determination of whether a fault condition exists on the data bus 18 is made based on whether the read back test data differs from the transmitted test data. In one example, the microprocessor 26 makes the determination after receiving the read back test data (and optionally also the transmitted test data) from the transceiver 12 over data bus 24. The microprocessor 26 in one example is already aware of what test data is transmitted on the data bus, and only needs the read back test data to make the determination. In one example, the transceiver 12 makes the determination.

In one example the transceiver 12 performs the transmission of test data, holding of the test data, and reading back of the test data using first test data, and if no fault condition is detected repeats those steps using second test data that differs from the first test data.

In one example, the second test data is the one's complement of the first test data (i.e., is a bit-inverted version of the first test data). In one such example for an 8-bit data bus, one of the first and second data is a binary value of 01010101 (55 in hexadecimal), and the other of the first and second test data is a binary value of 10101010 (AA in hexadecimal), which is the one's complement 01010101. In this fashion, each bit on the data bus 18 can be tested with both a high (1) value and a low (0) value.

In one example, the data bus 18 is an N-bit data bus and N transmissions of test data are used to test the data bus 18 using a "walking 1" or "walking 0" algorithm. In a walking 1 pattern, for example, all bits are driven to 0 except one that is driven to one (e.g., 10000000). The specific bit chosen is changed with each pattern until all bits have been tested as a 1 (e.g., second test data of 01000000, third test data of 00100000, etc.). This has the advantage of being able to detect more bit-to-bit shorts than the 55/AA test described above, but has the disadvantage of taking more time. Detection of bit-to-bit shorts requires differing bit values for detection (e.g., a 0 and a 1). In the example 55/AA test above, the $1^{st}$, $3^{rd}$, $5^{th}$, and $7^{th}$ bits always have the same value as one another, and so it would not be possible to detect bit-to-bit shorts between those bits, whereas such bit-to-bit shorts would be detectable using the walking 1 or walking 0 examples.

In one example, the transceiver 12 transmits the test data to an unused address on the data bus 18 that is not assigned to any of the devices 20A-C connected to the data bus 18, which causes the devices 20 to ignore the test data, and the transceiver 12 reads back the test data using the same or another unused address.

In another example, the transceiver transmits the test data to an address that is used by one of the devices 20, but the test data is read back from an unused address to avoid overdriving the bus-hold value.

The system 10 also includes random access memory (RAM) 27 that the microprocessor 26 can use for data storage. A control bus 28 is used for transmitting control signals from a logic block 30 to the transceiver 12 and plurality of devices 20. The logic block 28 may be a standalone device (as shown in FIG. 1) or may be part of the microprocessor 26, for example.

An address bus 32 connects to the microprocessor 26, random access memory 27, and logic block 30. The address bus 32 is used for assigning addresses to the devices 20 in one example. The logic block 30 is configured to instruct the transceiver 12 to transfer data between data bus 18 and data bus 24 as described above. The logic block 30 is also operable to instruct the transceiver 12 and/or a relevant one of the plurality of devices 20 about whether a read operation or a write operation is about to occur.

In one example, the logic block 30 sends a message over the control bus 28 to individual ones of the plurality of devices 20 when those individual devices 20 are being addressed. In another example, the plurality of devices 20 monitor the control bus 28 and make their own determination of when they are being addressed.

In one example, the system 10 is part of an aircraft, the input buffer 20C is used for providing an input status to the microprocessor 26, and the output latches 20A-B are used for providing commands to aircraft devices. The system 10 could also be used in other environments.

In one example, the address bus 32 is a 24-bit bus, the control bus 28 is a 4-bit bus, the data bus 24 is a 32-bit bus, and the data bus 18 is an 8-bit bus. Of course, other bit values could be used.

Figure 2:
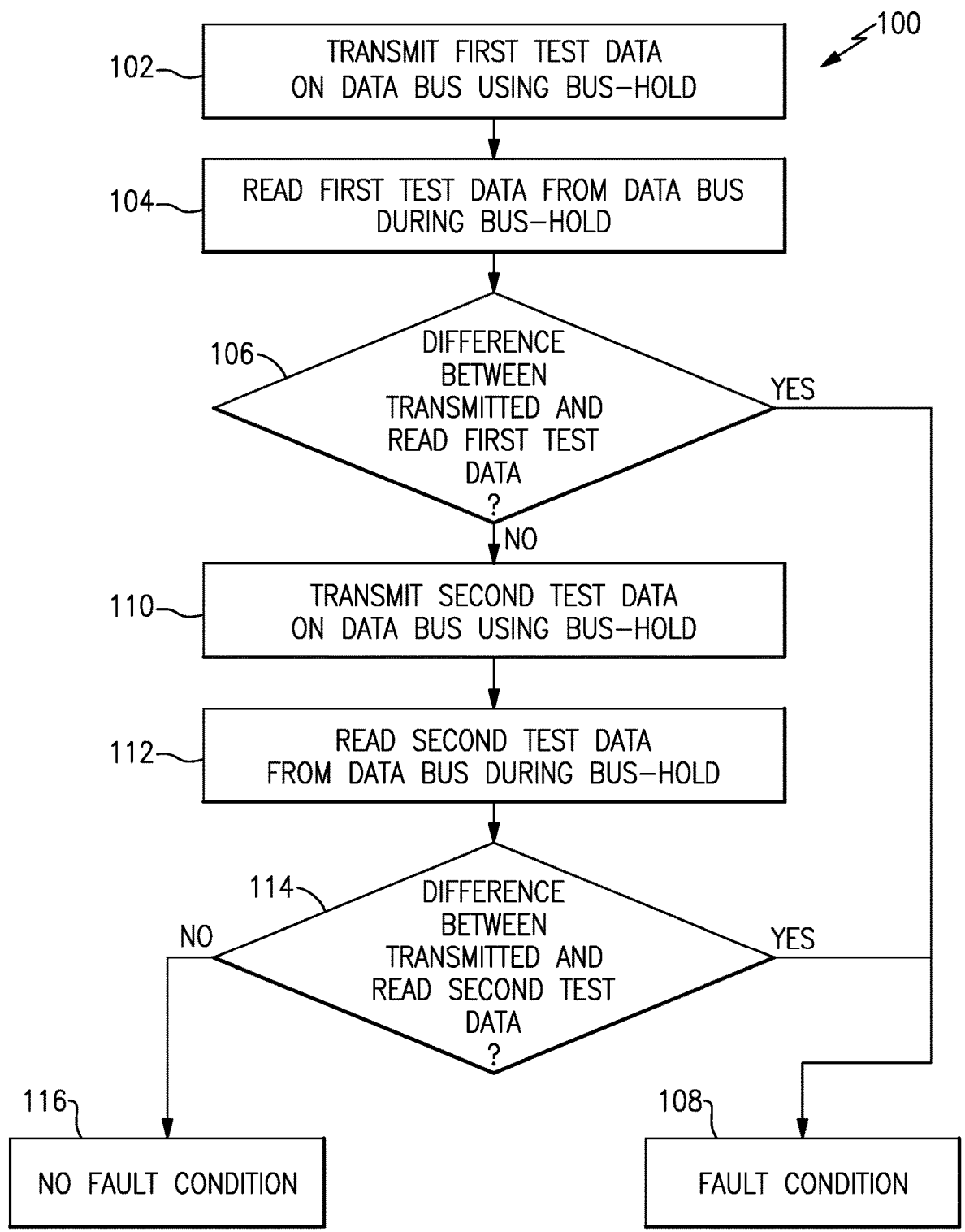
FIG. 2 is a flowchart representative of an example method of testing a data bus.

FIG. 2 is a flowchart 100 of an example method of testing the data bus 18. A first device transmits first test data on the data bus 18 using a bus-hold feature that maintains the first test data on the data bus 18 (block 102). The first device reads the first test data from the data bus 18 during application of the bus-hold feature (block 104). If the transmitted first test data differs from the read first test data (a "yes" to block 106), a second device determines that a fault condition exists on the data bus 18 (block 108).

Otherwise, if the transmitted first test data is the same as the read first test data (a "no" to block 106), the data bus 18 is functional for the first test data, and the first device performs another test using on the data bus 18 using second test data is different than the first test data (block 110). In one example, the second test data is the one's complement of the first test data. The first device reads the second test data from the data bus 18 during application of the bus-hold feature (block 112). If the transmitted second test data differs from the read second test data (a "yes" to block 114), the second device determines that a fault condition exists on the data bus 18 (block 108). Otherwise, if the transmitted second test data is the same as the read second test data (a "no" to block 114), the second device determines that the data bus 18 is functional for the second test data as well, and that consequently no fault condition exists on the data bus 18.

In one example, the first device is the transceiver 12 and the second device is the microprocessor 26. In one example, the first device and second device are the same device, which is the microprocessor 26. In one example, the first device and second device are the same device, which is the transceiver 12.

In one example, if the second device is the transceiver 12 and a fault condition is determined (block 108), the transceiver 12 transmits a notification to the microprocessor 26 over the data bus 24.

Some example fault conditions that could occur on the data bus 18 include one or more bits of the data bus 18 being shorted high or shorted low. Another example fault condition could include two or more bits of the data bus 18 being shorted to each other. If such bits were driven to different values they would not be fully high or low but would each have an intermediate in between voltage. Such faults correspond to a loss of integrity of the data bus 18 itself. Another example fault condition could include the input buffer 20C being stuck and continually driving data onto the data bus 18.

One known way to test a data bus is to use a memory device that includes read/write capabilities and is connected to the same data bus as a transceiver. Such a memory device could store test data received from the transceiver in a write operation and transmit the test data back to the transceiver in a read operation. However, this involves including the memory device as an extra component, and if the memory device is unavailable for any reason, the data bus could not be tested.

The use of the bus-hold-based testing of the data bus 18 improves upon such a method because a dedicated memory device for testing is not required on the data bus 18, providing a cost and space savings, and reducing a potential point of failure. By using the bus-hold features described above, the transceiver 12 or microprocessor 26 can effectively act as its own memory unit and testing device and mimic the functionality that would otherwise only be available from a secondary device.

Although example embodiments have been disclosed, a worker of ordinary skill in this art would recognize that certain modifications would come within the scope of this disclosure. For that reason, the following claims should be studied to determine the scope and content of this disclosure.

What is claimed is:

1. A data bus and testing system, comprising:
the data bus; and
a first device configured to:
transmit test data on the data bus;
hold the transmitted test data on the data bus using a bus-hold feature of the first device; and
read back the test data from the data bus during application of the bus-hold feature;
a second device configured to determine whether a fault condition exists on the data bus based on whether the read back test data differs from the transmitted test data; and
a plurality of additional devices connected to the data bus, each having a respective assigned address on the data bus;
wherein the first device is configured to transmit the test data to an unused address on the data bus that is not assigned to any device connected to the data bus.

2. The data bus and testing system of claim 1, wherein:
the first device is configured to initially perform the transmit, hold, and read back using first test data, and to repeat the transmit, hold, and read back using second test data that differs from the first test data; and
the determination is further based on the read back second test data differing from the transmitted second test data.

3. The data bus and testing system of claim 1, wherein the second test data is a one's complement of the first test data.

4. The data bus and testing system of claim 1, comprising:
a control bus that is separate from the data bus, wherein the first device and plurality of additional devices are configured to receive control signals over the control bus.

5. The data bus and testing system of claim 1, wherein the first device, data bus, and plurality of additional devices are part of an aircraft.

6. The data bus and testing system of claim 1,
wherein the first device is configured to transmit non-test data to the plurality of additional devices in transmissions over the data bus, each transmission of non-test data addressed to an assigned address of at least one of the plurality of additional devices.

7. The data bus and testing system of claim 6, wherein:
a group of the plurality of additional devices are output latches, each configured to receive non test data from the first device that is addressed to its assigned address, and output and hold the received non-test data received on a respective output line.

8. The data bus and testing system of claim 6, wherein the first device is also configured to utilize the bus-hold feature for the transmissions of non-test data.

9. The data bus and testing system of claim 6, wherein:
the first device is a transceiver;
the data bus is a first data bus;
the data bus system comprises an additional, second data bus that is separate from the first data bus and connects the transceiver to the second device, which comprises a microprocessor;
the transceiver is configured to provide the read back test data to the microprocessor over the second data bus; and
the non-test data that the transceiver transmits on the first data bus is first received from the microprocessor over the second data bus.

10. The data bus and testing system of claim 9, wherein the transceiver is configured to transmit non-test data received from the plurality of additional devices over the first data bus to the microprocessor over the second data bus.

11. The data bus and testing system of claim 1, wherein the first device and the second device are the same device.

12. A method of testing a data bus, comprising:
transmitting test data on the data bus;
holding the transmitted test data on the data bus using a bus-hold feature;
reading back the test data from the data bus during application of the bus-hold feature; and
determining whether a fault condition exists on the data bus based on whether the read back test data differs from the transmitted test data;
wherein the transmitting, holding, and reading are performed by a first device, and the bus-hold feature is a feature of the first device; and
wherein the data bus is connected to the first device and to a plurality of additional devices each having an address on the data bus, and the transmitting includes transmitting the test data to an unused address that is not assigned to any device connected to the data bus.

13. The method of claim 12, wherein:
the transmitting, holding, and reading back are initially performed using first test data;
the method comprises repeating the transmitting, holding, and reading using second test data that differs from the first test data; and
the determining is further based on the read back second test data differing from the transmitted second test data.

14. The method of claim 13, wherein the second test data is a one's complement of the first test data.

15. The method of claim 12, wherein the determining is also performed by the first device.

16. The method of claim 12, wherein the first device is a transceiver, and the determining is performed by a microprocessor that is separate from the transceiver.

17. The method of claim 12, comprising:
transmitting non-test data over the data bus; and
holding the transmitted non-test data on the data bus using the bus-hold feature.

18. The method of claim 16, wherein:
the data bus is a first data bus;
the method comprises receiving the non-test data from an additional device that is separate from the first device over an additional second data bus that is separate from the first data bus prior to transmitting and holding the non-test data on the first data bus.

* * * * *